(12) United States Patent
Izumiya et al.

(10) Patent No.: US 10,498,108 B2
(45) Date of Patent: Dec. 3, 2019

(54) SURFACE-EMITTING LASER ARRAY, LASER APPARATUS, IGNITION DEVICE AND INTERNAL COMBUSTION ENGINE

(71) Applicants: Kazuma Izumiya, Miyagi (JP); Naoto Jikutani, Miyagi (JP); Masayuki Numata, Kanagawa (JP)

(72) Inventors: Kazuma Izumiya, Miyagi (JP); Naoto Jikutani, Miyagi (JP); Masayuki Numata, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 195 days.

(21) Appl. No.: 15/551,955

(22) PCT Filed: Mar. 8, 2016

(86) PCT No.: PCT/JP2016/001265
§ 371 (c)(1),
(2) Date: Aug. 18, 2017

(87) PCT Pub. No.: WO2016/147608
PCT Pub. Date: Sep. 22, 2016

(65) Prior Publication Data
US 2018/0034244 A1 Feb. 1, 2018

(30) Foreign Application Priority Data

Mar. 16, 2015 (JP) .................................. 2015-051556
Aug. 26, 2015 (JP) .................................. 2015-166726

(51) Int. Cl.
*H01S 5/00* (2006.01)
*H01S 5/42* (2006.01)
(Continued)

(52) U.S. Cl.
CPC .............. *H01S 5/423* (2013.01); *F02P 23/04* (2013.01); *H01S 3/005* (2013.01); *H01S 3/061* (2013.01);
(Continued)

(58) Field of Classification Search
CPC ........ H01S 5/423; H01S 5/026; H01S 5/0425; H01S 5/18361; H01S 5/22;
(Continued)

(56) References Cited

U.S. PATENT DOCUMENTS 5,903,590 A * 5/1999 Hadley ............... H01S 5/18391
372/45.01
7,746,912 B2 6/2010 Motomura et al.
(Continued)

FOREIGN PATENT DOCUMENTS

JP 2002-198613 7/2002
JP 2003-086895 3/2003
(Continued)

OTHER PUBLICATIONS

International Search Report dated May 31, 2016 in PCT/JP2016/001265 filed on Mar. 8, 2016.
(Continued)

*Primary Examiner* — Kinam Park
(74) *Attorney, Agent, or Firm* — IPUSA, PLLC

(57) ABSTRACT

A surface-emitting laser array includes a plurality of light emitting parts. Each light emitting part includes a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

12 Claims, 15 Drawing Sheets

(51) Int. Cl.

| | | |
|---|---|---|
| *F02P 23/04* | (2006.01) | |
| *H01S 3/00* | (2006.01) | |
| *H01S 3/06* | (2006.01) | |
| *H01S 3/0941* | (2006.01) | |
| *H01S 3/11* | (2006.01) | |
| *H01S 3/16* | (2006.01) | |
| *H01S 5/026* | (2006.01) | |
| *H01S 5/042* | (2006.01) | |
| *H01S 5/183* | (2006.01) | |
| *H01S 5/22* | (2006.01) | |
| *H01S 5/343* | (2006.01) | |

(52) U.S. Cl.
CPC ............ *H01S 3/09415* (2013.01); *H01S 3/11* (2013.01); *H01S 3/1115* (2013.01); *H01S 3/1611* (2013.01); *H01S 3/1643* (2013.01); *H01S 5/026* (2013.01); *H01S 5/0425* (2013.01); *H01S 5/18361* (2013.01); *H01S 5/22* (2013.01); *H01S 5/18313* (2013.01); *H01S 5/3432* (2013.01); *H01S 5/34353* (2013.01)

(58) Field of Classification Search
CPC ............ H01S 5/34313; H01S 5/18313; H01S 5/3202; H01S 5/3432; H01S 5/34353; H01S 5/42; H01S 5/343; H01S 3/005; H01S 3/061; H01S 3/09415; H01S 3/11; H01S 3/1115; H01S 3/1611; H01S 3/1643; H01S 3/0606; H01S 3/0621; H01S 3/0627; H01S 3/094053; H01S 3/113; H01S 3/1685
See application file for complete search history.

(56) References Cited

U.S. PATENT DOCUMENTS

| | | | |
|---|---|---|---|
| 8,035,676 B2 | 10/2011 | Harasaka et al. | |
| 8,111,725 B2 | 2/2012 | Ishii et al. | |
| 8,208,511 B2 | 6/2012 | Sato et al. | |
| 8,340,148 B2 | 12/2012 | Jikutani et al. | |
| 8,441,511 B2 | 5/2013 | Harasaka et al. | |
| 8,483,254 B2 | 7/2013 | Harasaka et al. | |
| 8,502,852 B2 | 8/2013 | Numata et al. | |
| 8,594,146 B2 | 11/2013 | Jikutani et al. | |
| 8,624,950 B2 | 1/2014 | Jikutani et al. | |
| 8,649,407 B2 | 2/2014 | Harasaka et al. | |
| 8,675,271 B2 | 3/2014 | Jikutani et al. | |
| 8,774,242 B2 | 7/2014 | Itoh et al. | |
| 8,824,517 B2 | 9/2014 | Jikutani et al. | |
| 8,855,159 B2 | 10/2014 | Sato et al. | |
| 8,879,600 B2 | 11/2014 | Hanaoka et al. | |
| 8,891,571 B2 | 11/2014 | Jikutani et al. | |
| 8,958,449 B2 | 2/2015 | Harasaka et al. | |
| 9,046,808 B2 | 6/2015 | Izumiya et al. | |
| 9,570,887 B2 | 2/2017 | Jikutani et al. | |
| 2007/0047607 A1* | 3/2007 | Kushibe .............. H01S 5/18308 372/46.01 |
| 2007/0230529 A1* | 10/2007 | Mochizuki .......... H01S 5/18386 372/46.01 |
| 2007/0258499 A1* | 11/2007 | Mochizuki ............. B82Y 20/00 372/50.1 |
| 2008/0205462 A1 | 8/2008 | Uchida | |
| 2011/0316961 A1 | 12/2011 | Hanaoka | |
| 2013/0272330 A1 | 10/2013 | Joseph et al. | |

FOREIGN PATENT DOCUMENTS

| | | |
|---|---|---|
| JP | 2005-191343 | 7/2005 |
| JP | 2011-114227 | 6/2011 |
| JP | 2012-195431 | 10/2012 |
| WO | 2014/156544 | 10/2014 |

OTHER PUBLICATIONS

Extended European Search Report for 16764441.8 dated Mar. 2, 2018.

* cited by examiner

[Fig. 1]
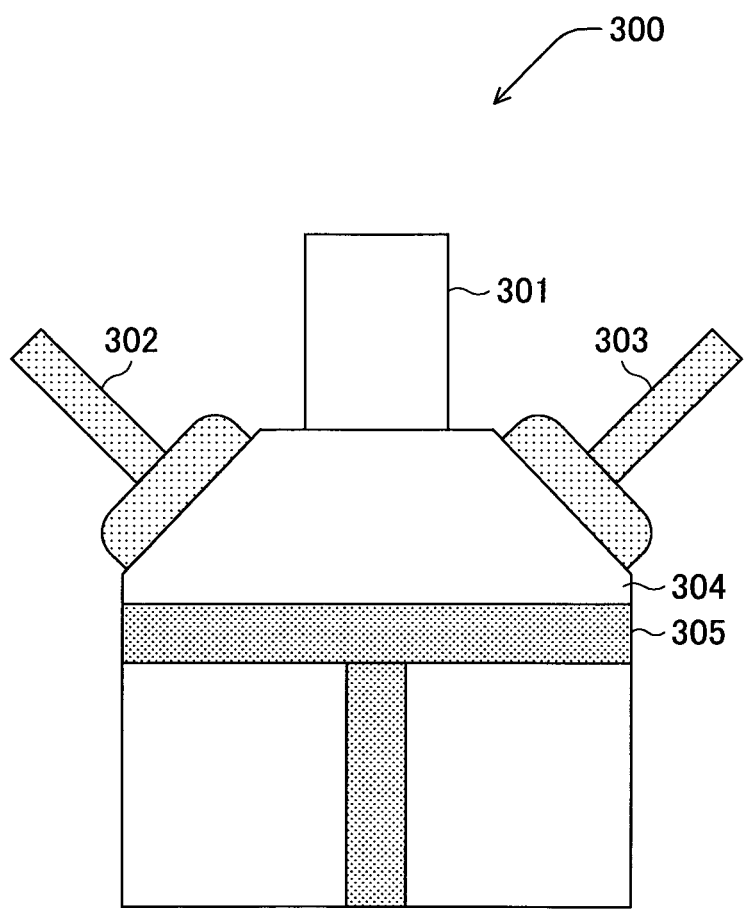

[Fig. 2]
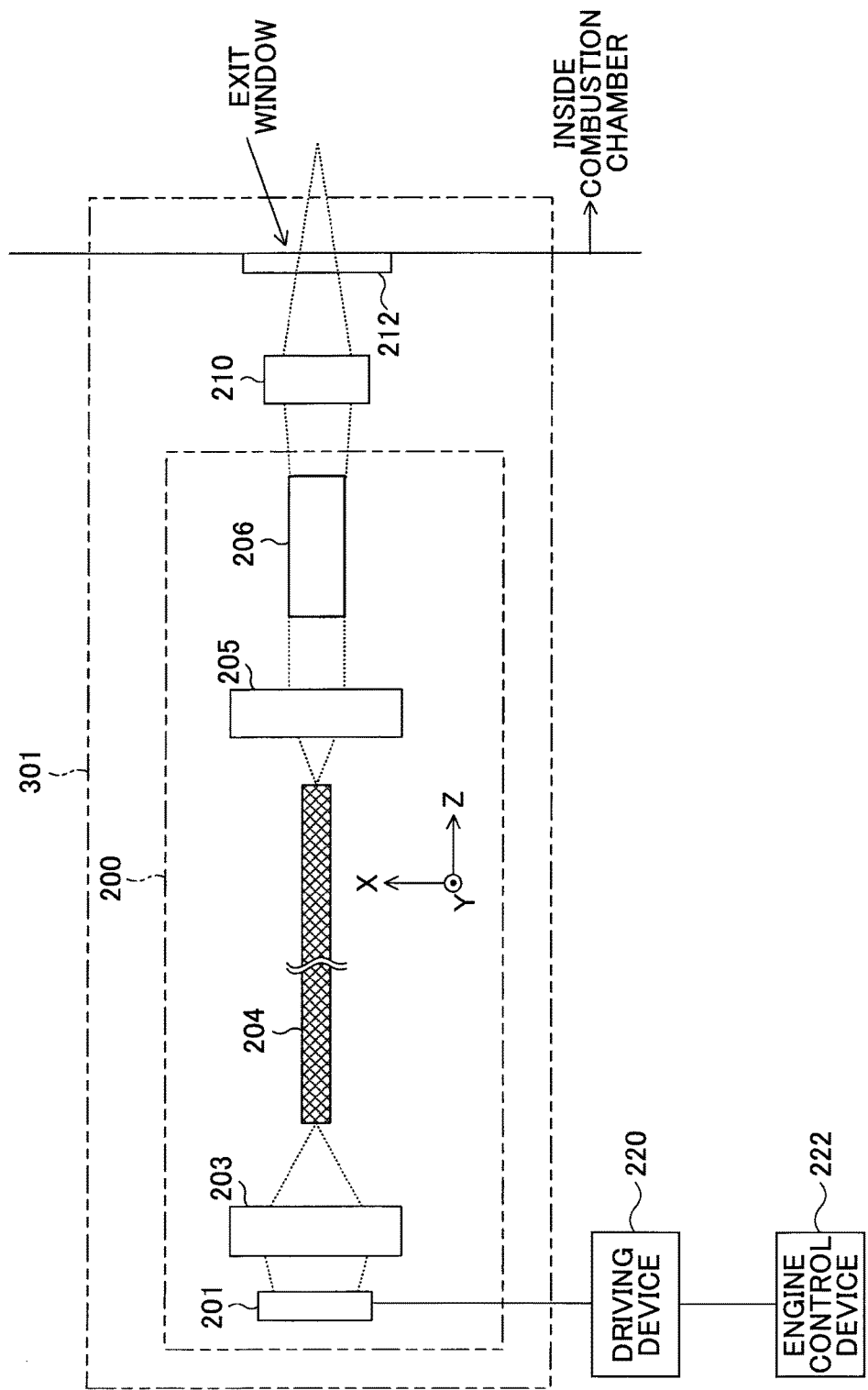

[Fig. 3]
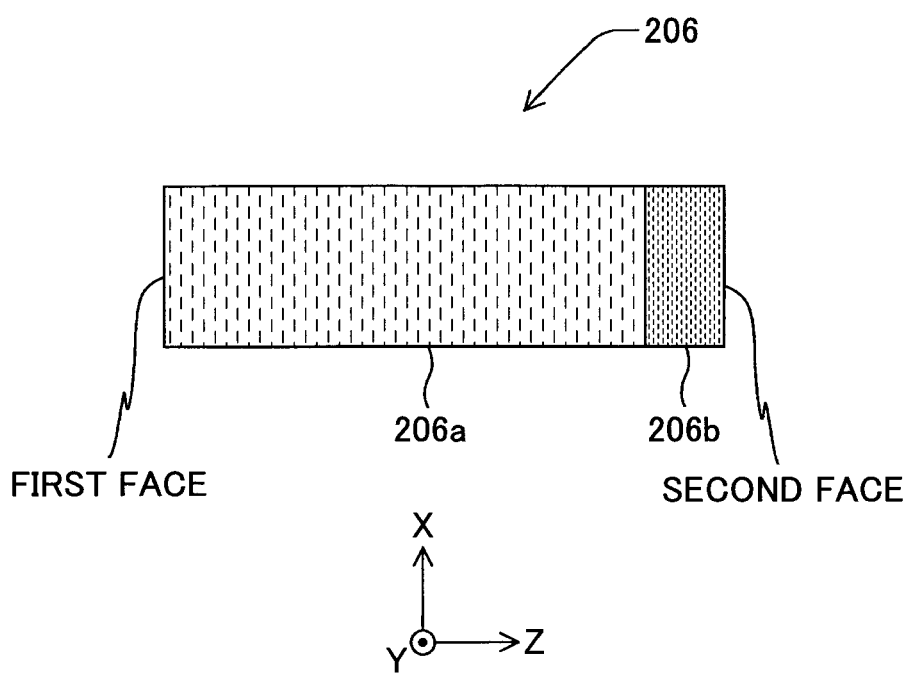

[Fig. 4]
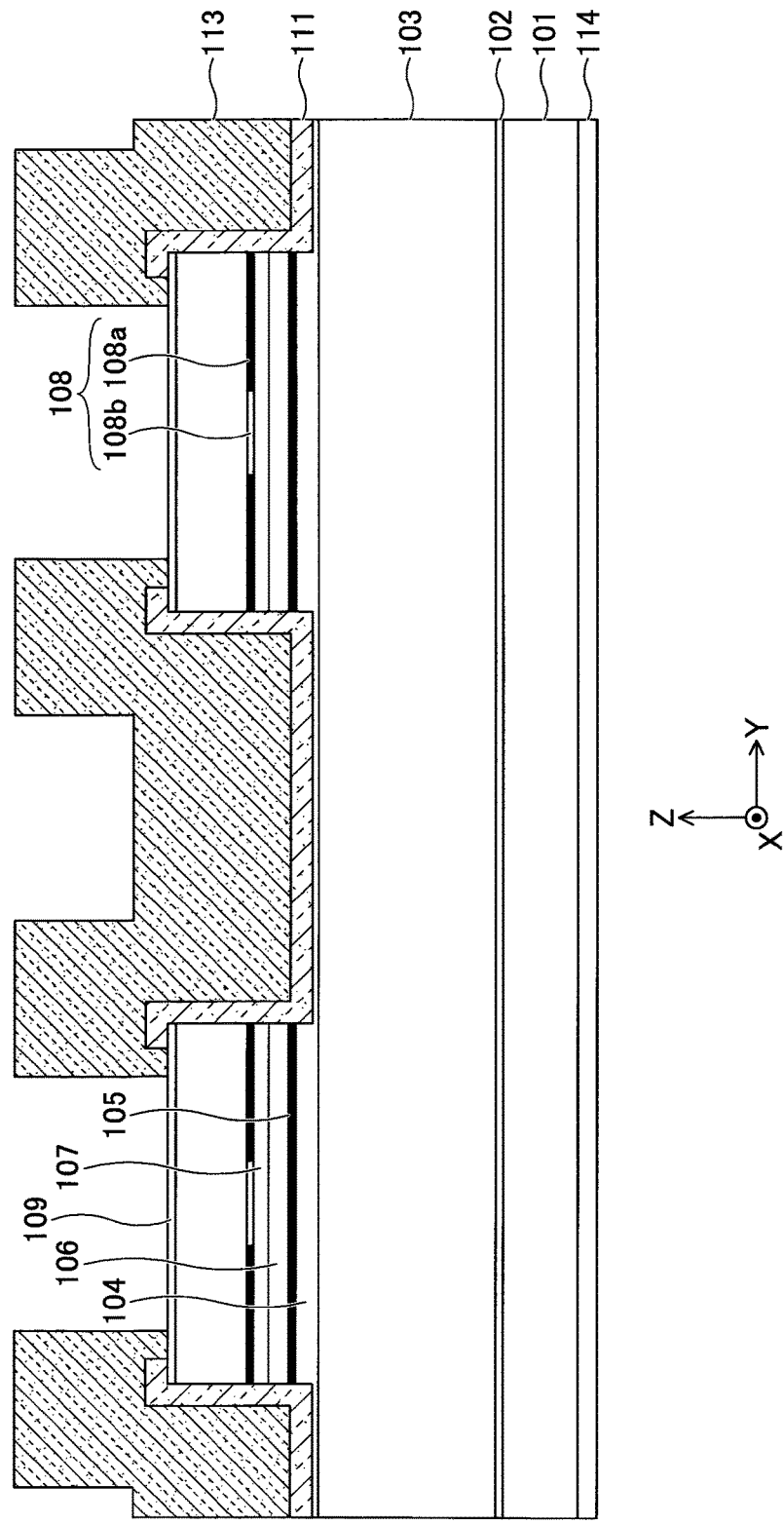

[Fig. 5A]
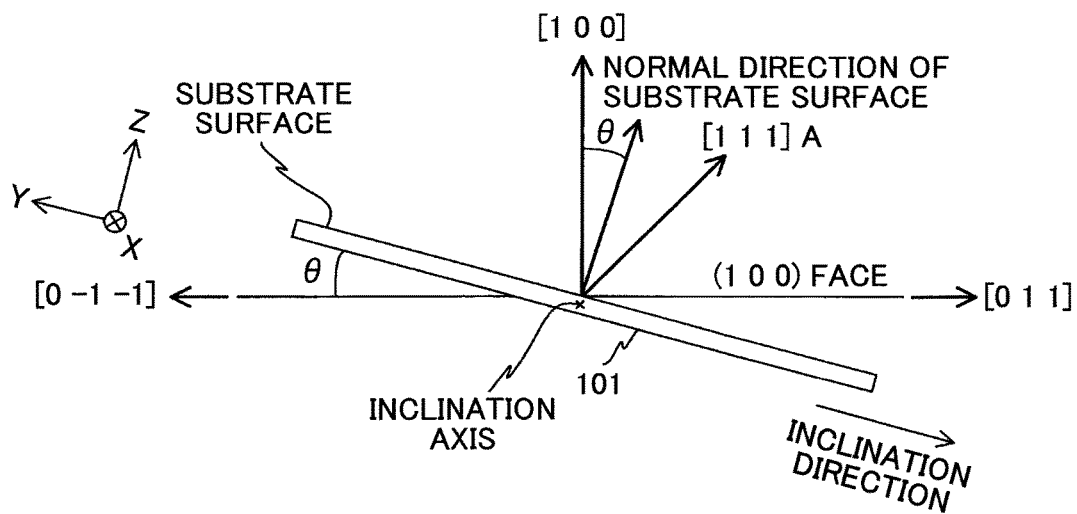
[Fig. 5B]
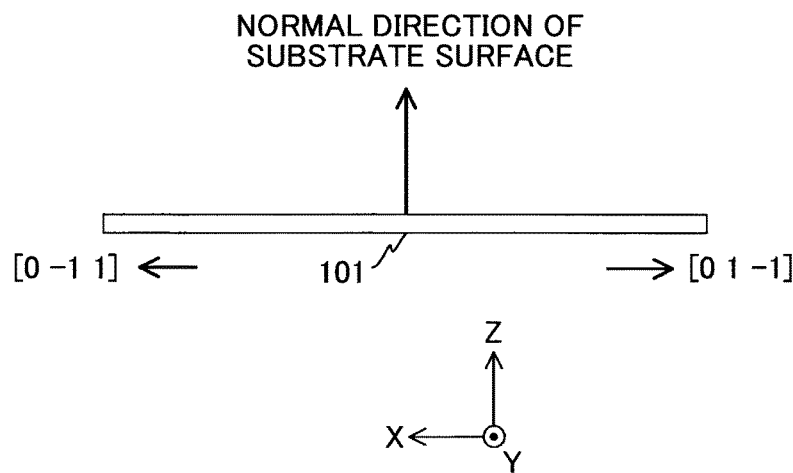

[Fig. 6]
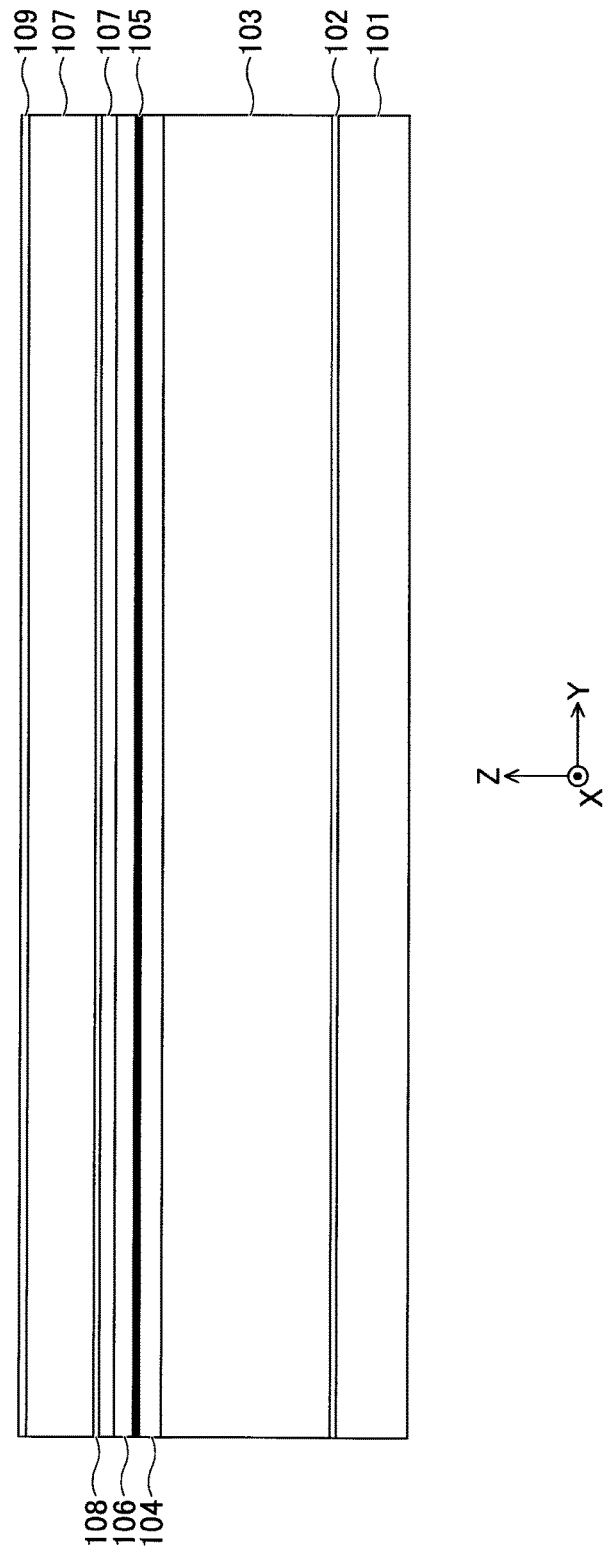

[Fig. 7]
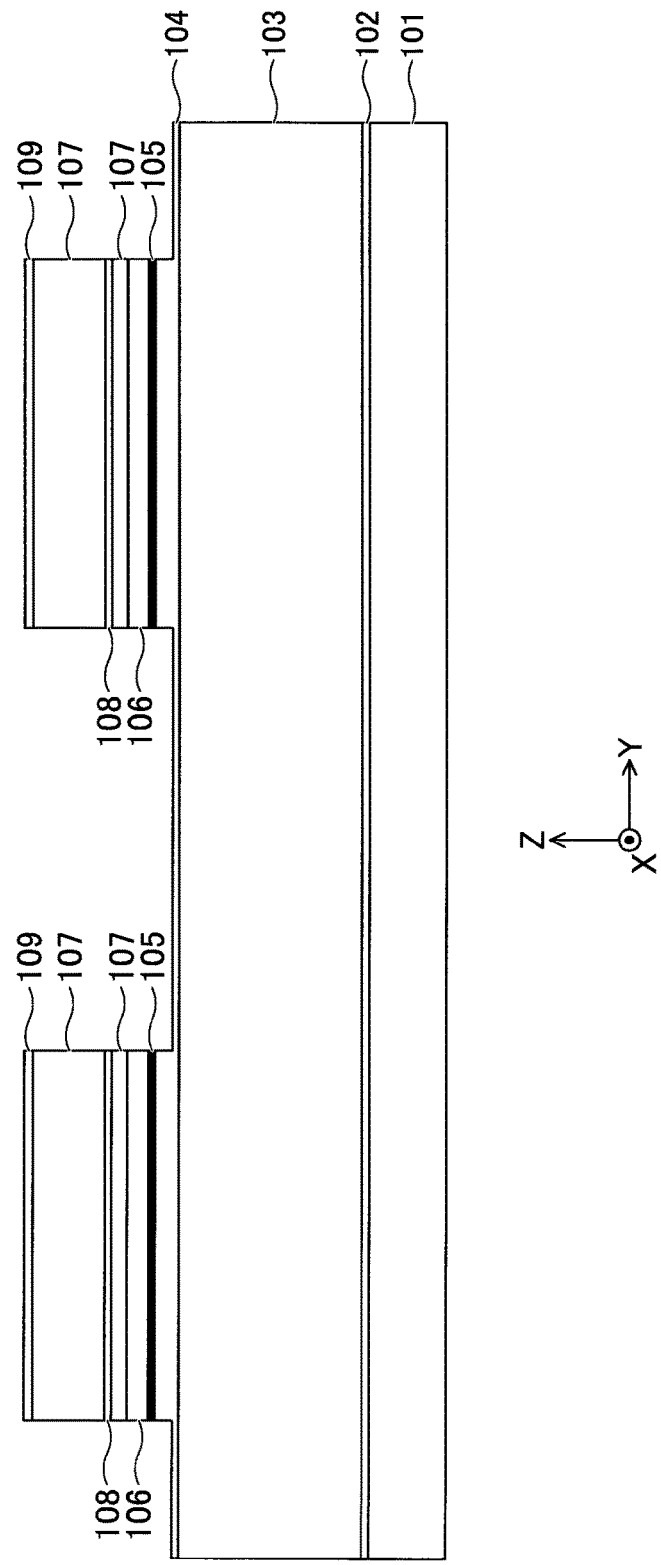

[Fig. 8]
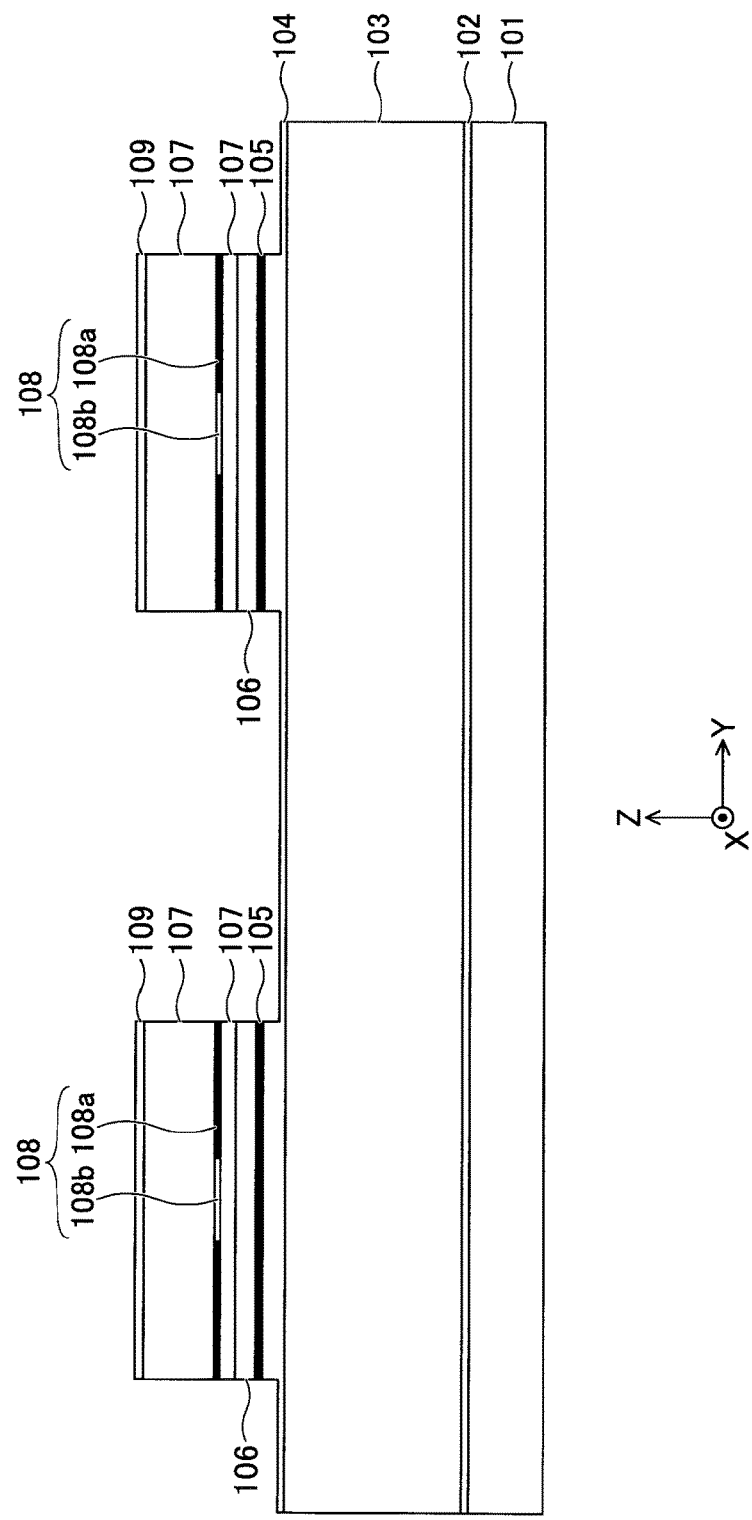

[Fig. 9]
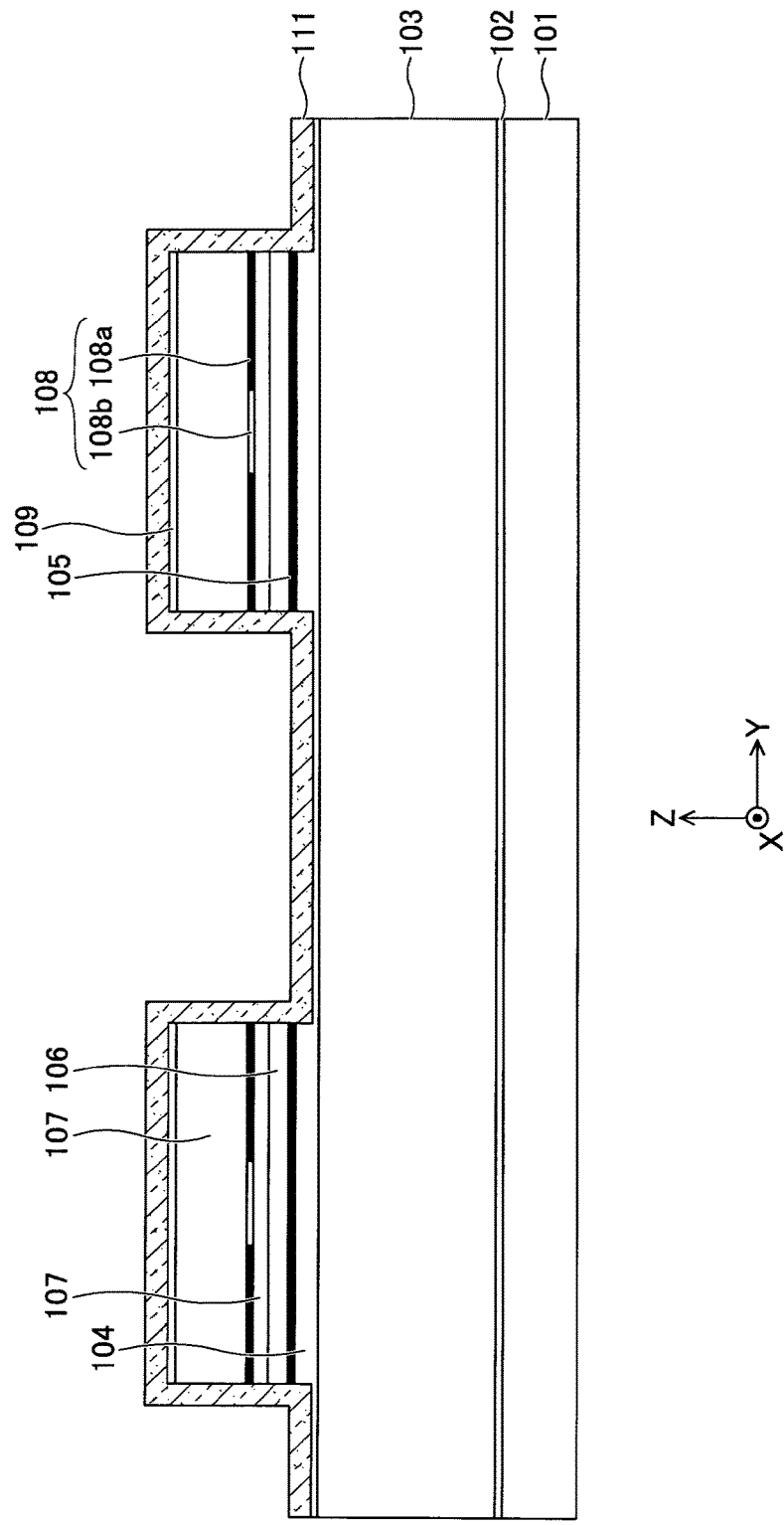

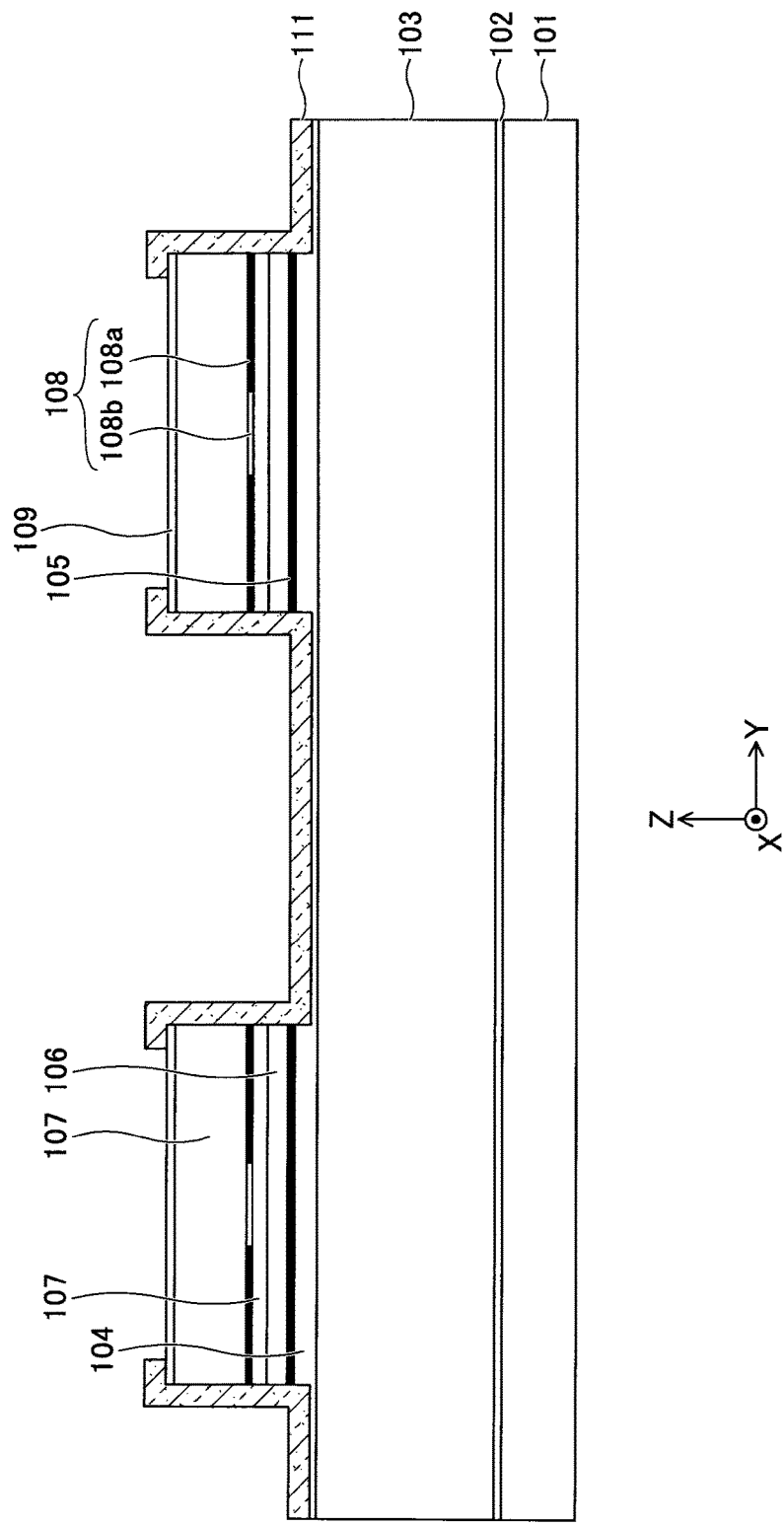
[Fig. 10]

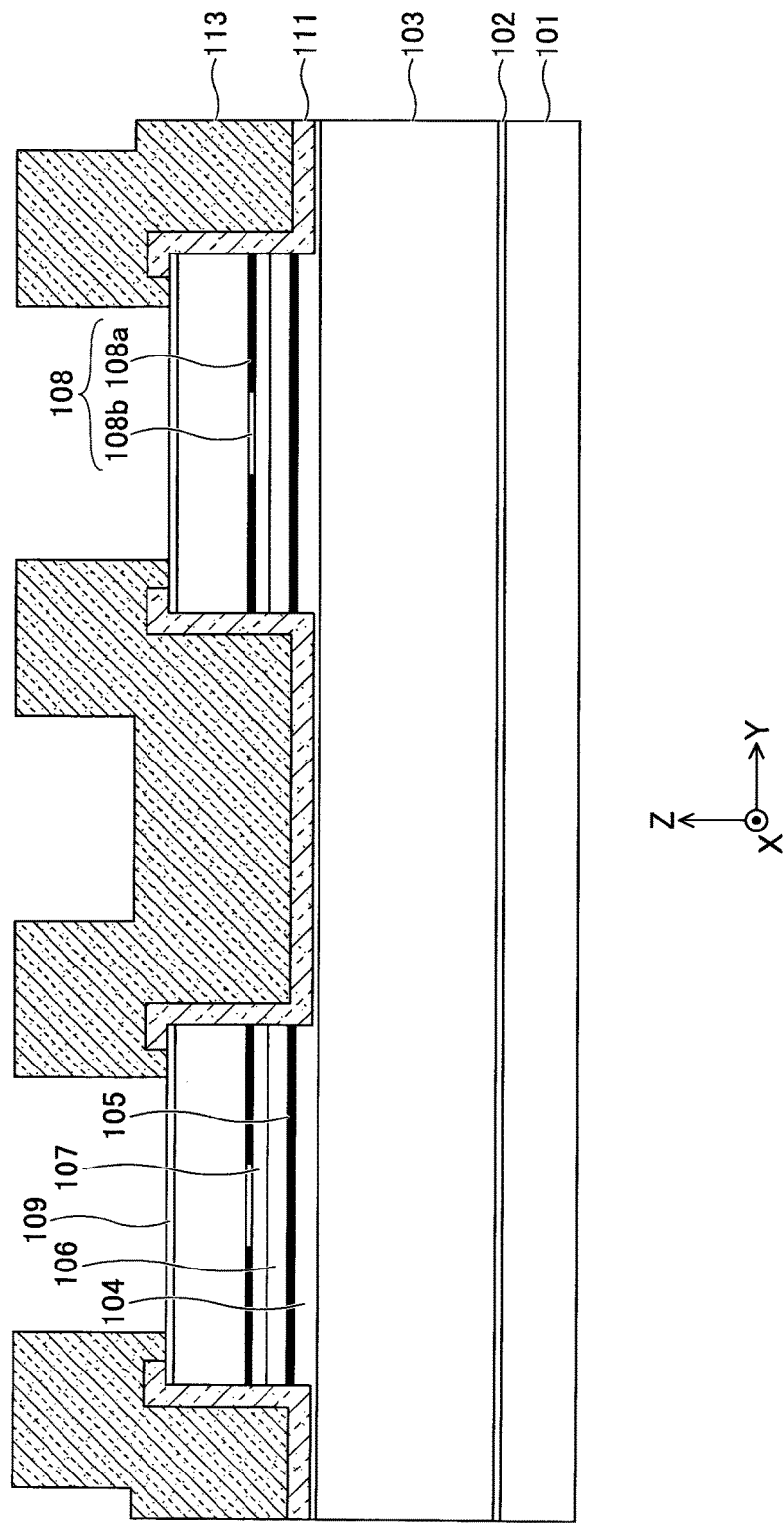
[Fig. 11]

[Fig. 12]
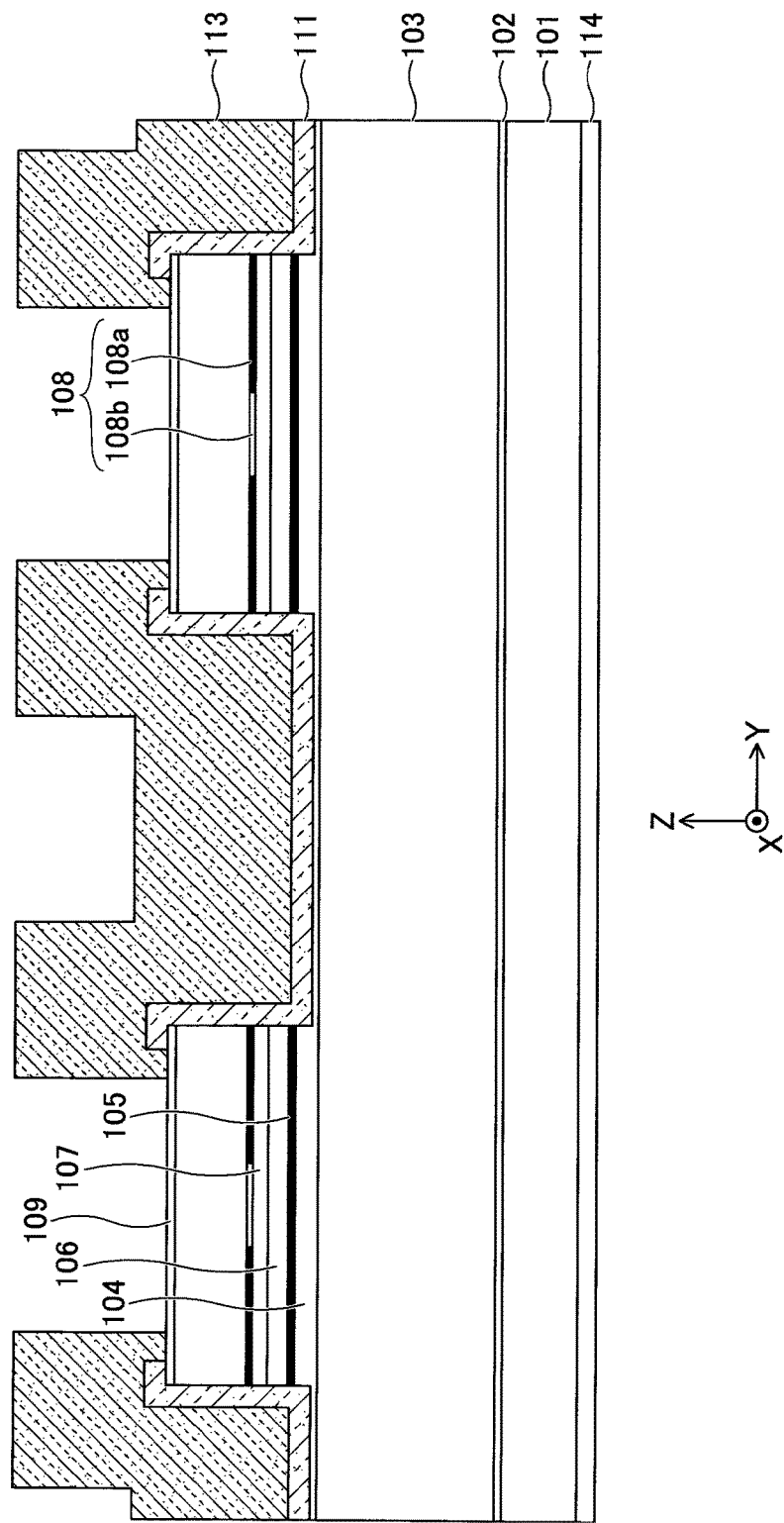

[Fig. 13]
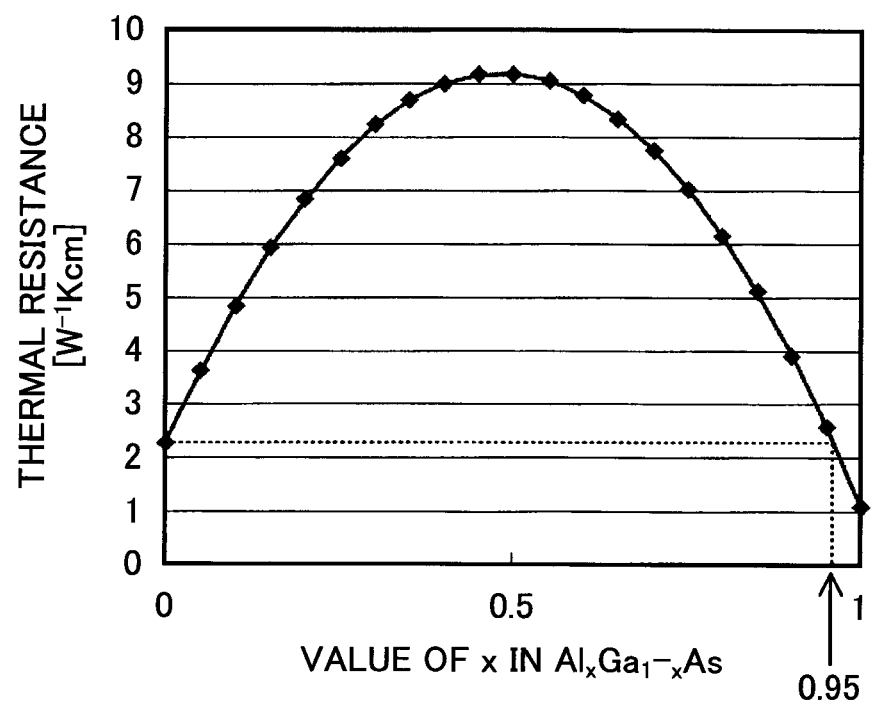

[Fig. 14A]
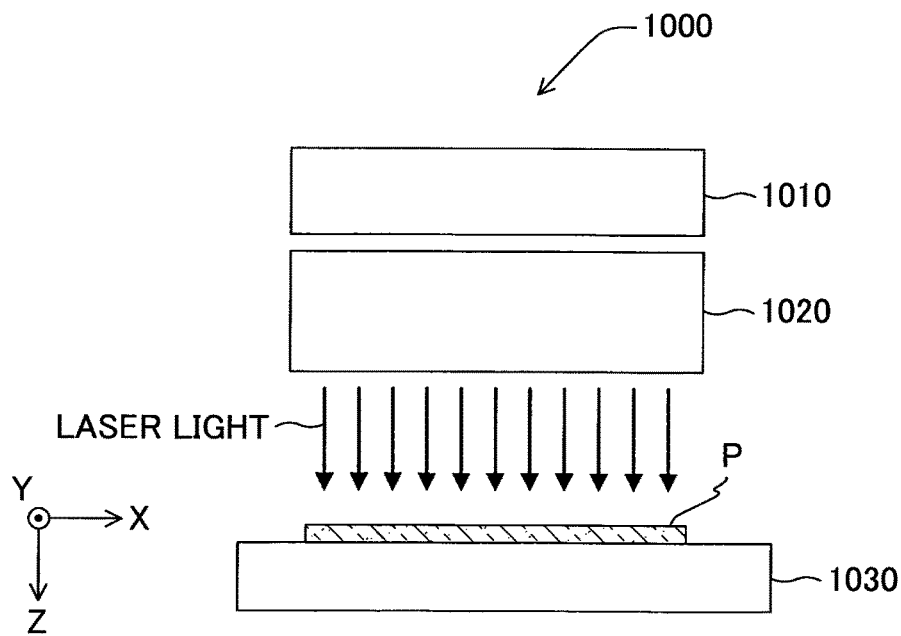
[Fig. 14B]
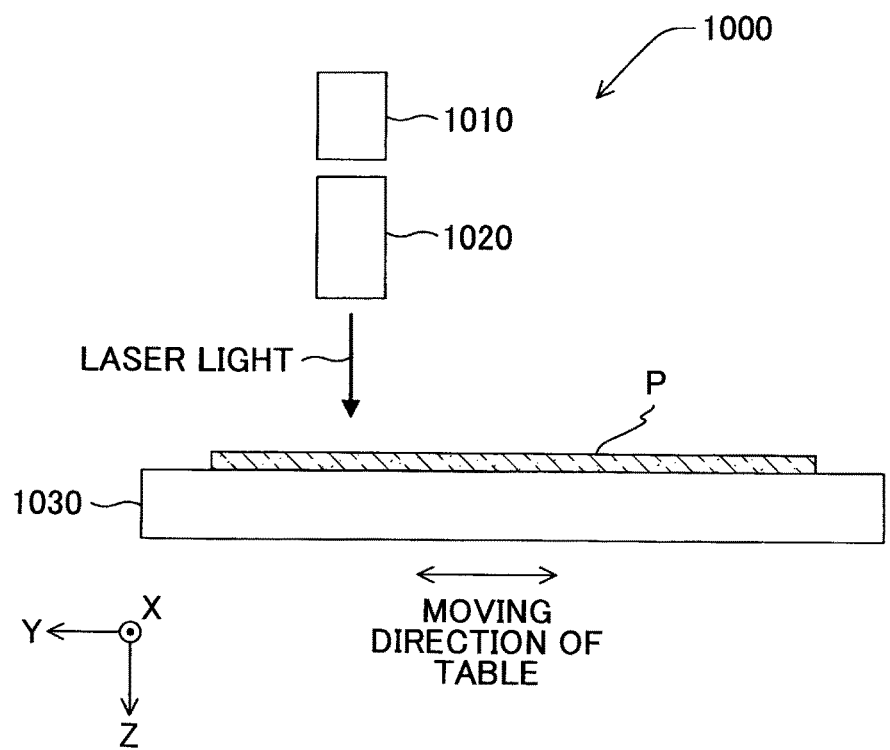

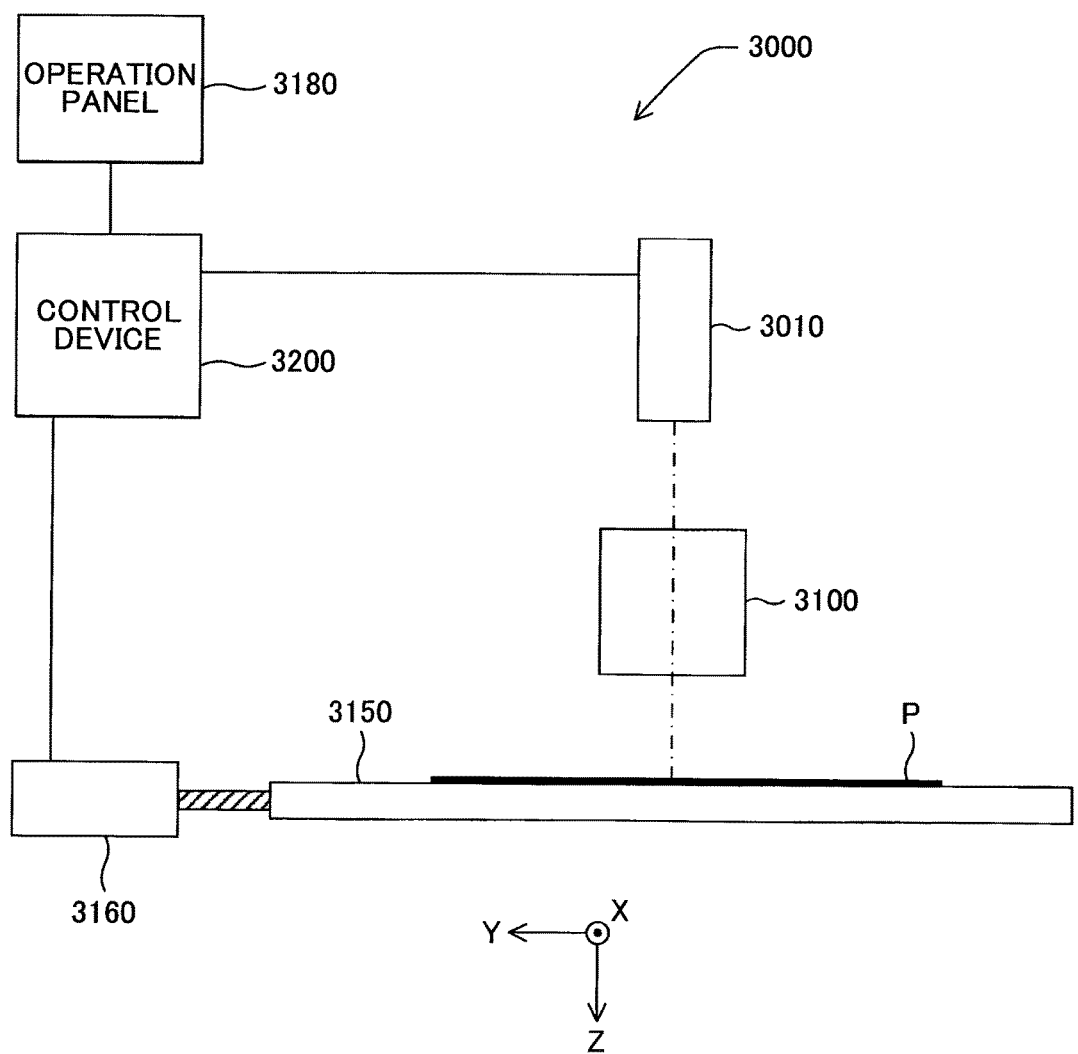
[Fig. 15]

SURFACE-EMITTING LASER ARRAY, LASER APPARATUS, IGNITION DEVICE AND INTERNAL COMBUSTION ENGINE

TECHNICAL FIELD

The disclosure herein generally relates to a surface-emitting laser array, a laser apparatus, an ignition device and an internal combustion engine, and more particularly, to a surface-emitting laser array having a plurality of light emitting parts, a laser apparatus and an ignition device having the surface-emitting laser array, and an internal combustion engine provided with the ignition device.

BACKGROUND ART

A vertical cavity surface emitting laser (VCSEL) is a semiconductor laser which performs laser oscillation in a direction orthogonal to a substrate, and has a feature of quite high stability of wavelengths to heat and a feature that it is easy to increase high output by making an array.

For example, Patent Document 1 discloses a method for manufacturing a surface emitting laser having steps of forming on a compound semiconductor substrate, a laminated film which includes a lower semiconductor multi-layer film reflection mirror, a lower spacer layer, an active layer, an upper spacer layer and an upper multi-layer reflection mirror, and processing the laminated film into a mesa structure by using a dry etching method.

Then, the surface emitting laser array, in which surface emitting lasers are arrayed, can emit laser light with high output, and applications to various apparatuses are considered.

CITATION LIST

Patent Literature

[PTL 1] Japanese Laid-Open Patent Publication No. 2005-191343

SUMMARY OF INVENTION

Technical Problem

However, in the surface emitting laser array according to the related art, it is difficult to satisfy both radiation performance and corrosion resistance.

Solution to Problem

According to an aspect of the invention, a surface-emitting laser array includes a plurality of light emitting parts, each including a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

According to another aspect of the invention, a laser device for irradiating an object with laser light includes a surface-emitting laser array; and an optical system configured to guide laser light emitted from the surface-emitting laser array to the object. The surface-emitting laser array includes a plurality of light emitting parts, each including a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

According to yet another aspect of the invention, a laser device includes a surface-emitting laser array; an optical system configured to condense laser light emitted from the surface-emitting laser array; and a transmission member configured to transmit the laser light condensed by the optical system. The surface-emitting laser array includes a plurality of light emitting parts, each including a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

According to yet another aspect of the invention, a laser device includes a surface-emitting laser array; and a laser resonator configured to receive laser light emitted from the surface-emitting laser array. The surface-emitting laser array includes a plurality of light emitting parts, each including a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

According to yet another aspect of the invention, an ignition device includes a laser device; and an optical system configured to condense laser light emitted from the laser device. The laser device includes a surface-emitting laser array; and a laser resonator configured to receive laser light emitted from the surface-emitting laser array. The surface-emitting laser array includes a plurality of light emitting parts, each including a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

According to yet another aspect of the invention, an internal combustion engine for combusting fuel to generate a combustion gas includes an ignition device for igniting the fuel. The ignition device includes a laser device; and an optical system configured to condense laser light emitted from the laser device. The laser device includes a surface-emitting laser array; and a laser resonator configured to receive laser light emitted from the surface-emitting laser array. The surface-emitting laser array includes a plurality of light emitting parts, each including a reflection mirror including aluminum gallium arsenide ($Al_xGa_{(1-x)}As$) where x is greater than 0.95 but less than or equal to 1; an active layer; and an electrode surrounding an emission region, from which laser light is emitted, the electrode covering a region between adjacent light emitting parts in the plurality of light emitting parts.

Advantageous Effects of Invention

According to the surface-emitting laser array of the present invention, it is possible to satisfy both radiation performance and corrosion resistance.

BRIEF DESCRIPTION OF DRAWINGS

FIG. 1 is a diagram for schematically explaining an engine 300 according to embodiments.

FIG. 2 is a diagram for explaining an ignition device 301.

FIG. 3 is a diagram for explaining a laser resonator 206.

FIG. 4 is a diagram for explaining a configuration of a surface-emitting laser array 201.

FIG. 5A is a diagram for explaining a substrate of the surface-emitting laser array 201.

FIG. 5B is a diagram for explaining the substrate of the surface-emitting laser array 201.

FIG. 6 is a diagram for explaining a first example of a manufacturing method for the surface emitting laser array 201.

FIG. 7 is a diagram for explaining a second example of the manufacturing method for the surface emitting laser array 201.

FIG. 8 is a diagram for explaining a third example of the manufacturing method for the surface emitting laser array 201.

FIG. 9 is a diagram for explaining a fourth example of the manufacturing method for the surface emitting laser array 201.

FIG. 10 is a diagram for explaining a fifth example of the manufacturing method for the surface emitting laser array 201.

FIG. 11 is a diagram for explaining a sixth example of the manufacturing method for the surface emitting laser array 201.

FIG. 12 is a diagram for explaining a seventh example of the manufacturing method for the surface emitting laser array 201.

FIG. 13 is a diagram for explaining a relation between the value of x in $Al_xGa_{1-x}As$ and a thermal resistance.

FIG. 14A is a diagram for schematically explaining a configuration of a laser annealing device.

FIG. 14B is a diagram for schematically explaining the configuration of the laser annealing device.

FIG. 15 is a diagram for schematically explaining a configuration of a laser processing machine.

DESCRIPTION OF EMBODIMENTS

<Outline>

In the following, an embodiment of the present invention will be described with reference to drawings. FIG. 1 is a diagram schematically illustrating a main part of an engine 300 as an internal combustion engine according to the embodiments.

The engine 300 includes an ignition device 301, a fuel injection mechanism 302, an exhaust mechanism 303, a combustion chamber 304, a piston 305 and the like.

An operation of the engine 300 will be briefly described as follows:

(1) The fuel injection mechanism 302 injects a combustible mixture gas of fuel and air into the combustion chamber 304 (intake);

(2) The piston 305 rises and compresses the combustible mixture gas (compression);

(3) The ignition device 301 emits laser light to the inside of the combustion chamber 304. Then, the fuel is ignited (ignition);

(4) A combustion gas is generated and the piston 305 descends (combustion); and (5) The exhaust mechanism 303 exhausts the combustion gas to the outside of the combustion chamber 304 (emission).

In this way, a set of processes including intake, compression, ignition, combustion and emission is repeated. Then, the piston 305 moves corresponding to the change in volume of the gas in the combustion chamber 304, and kinetic energy is generated. As the fuel, for example, natural gas, gasoline or the like is used.

Meanwhile, the engine 300 performs the above-described operation based on instructions by an engine control device, which is arranged outside the engine 300 and electrically coupled to the engine 300.

The ignition device 301 includes, for example, as shown in FIG. 2, a laser device 200, an emission optical system 210, a protection member 212 and the like. To the ignition device 301, a driving device 220 and an engine control device 222 are coupled.

The emission optical system 210 condenses light emitted from the laser device 200. Therefore, at a condensing point, high energy density can be obtained.

The protection member 212 is a transparent window arranged facing the combustion chamber 304. Here, for example, sapphire glass is used as a material of the protection member 212.

The laser device 200 includes a surface emitting laser array 201, a first condensing optical system 203, an optical fiber 204, a second condensing optical system 205 and a laser resonator 206. Meanwhile, in the specification of the present application, a xyz three-dimensional orthogonal coordinate system is used, and the description will be performed assuming that the emission direction of light from the surface-emitting laser array 201 is +z-direction.

The surface-emitting laser array 201 is a light source for excitation and includes a plurality of light emitting parts. Each of the light emitting parts is a vertical cavity surface emitting laser (VCSEL).

According to the feature of quite small deviation of wavelength of emitted light due to temperature, a surface-emitting laser array is a favorable light source for exciting a Q switch laser, a characteristic of which may drastically change due to wavelength deviation. Therefore, the surface-emitting laser array has an advantage that it becomes simple to control environmental temperature in a case of using for a light source for excitation.

The first condensing optical system 203 condenses light emitted from the surface-emitting laser array 201.

The optical fiber 204 is arranged so that a center of an end face of a core on the −Z side is positioned at a spot where light is condensed by the first condensing optical system 203.

According to the optical fiber 204 arranged as above, the surface-emitting laser array 201 can be arranged at a position separated from the laser resonator 206. Therefore, it becomes possible to increase a degree of freedom for arrangement design. Moreover, since a heat source can be moved away from the surface-emitting laser array 201 in a case of using the laser device 200 for an ignition device, it becomes possible to increase a range of a method for cooling the engine 300.

Light entering the optical fiber 204 propagates in a core, and is emitted from the end face of the core on the +Z side.

The second condensing optical system 205 is arranged on an optical path of light emitted from the optical fiber 204, and condenses the light. Light condensed by the second condensing optical system 205 enters the laser resonator 206.

The laser resonator 206 is a Q switch laser, and includes, for example, as shown in FIG. 3, a laser medium 206a and a saturable absorber 206b.

The laser medium 206a is a Nd:YAG crystal having a rectangular parallelepiped shape with a resonator length of 8 mm. The saturable absorber 206b is a Cr:YAG crystal having a rectangular parallelepiped shape with a resonator length of 2 mm.

Meanwhile, here, the Nd:YAG crystal and the Cr:YAG crystal are joined to form a so-called composite crystal. Moreover, any of the Nd:YAG crystal and the Cr:YAG crystal are ceramics.

Light from the second condensing optical system 205 enters the laser medium 206a. That is, the laser medium 206a is excited by the light from the second condensing optical system 205. Meanwhile, wavelength of the light emitted from the surface-emitting laser array 201 is preferably 808 nm, which is a wavelength having the greatest absorption efficiency in a YAG crystal. Moreover, the saturable absorber 206b performs an operation for a Q switch.

A face of the laser medium 206a on an incident side (−Z side) and a face of the saturable absorber 206b on an emission side (+Z side) are subjected to an optical polishing treatment, and play roles of mirrors. Meanwhile, in the following, for the sake of simplicity, the face of the laser medium 206a on the incident side will also be called "first face", and the face of the saturable absorber 206b on the emission side will be called "second face" (See FIG. 3).

Furthermore, on the first face and the second face, dielectric films are coated depending on the wavelength of the light emitted from the surface-emitting laser array 201 and the wavelength of the light emitted from the laser resonator 206, respectively.

Specifically, the first face is subjected to a coating which exhibits sufficiently great transmission factor for light with a wavelength of 808 nm and exhibits sufficiently great reflectance for light with a wavelength of 1064 nm. Moreover, the second face is subjected to a coating exhibiting reflectance selected so that a desired threshold value can be obtained for light with a wavelength of 1064 nm.

According to the above-described configuration, light resonates and is amplified. Here, the resonator length of the laser resonator 206 is 10 mm, i.e. sum of 8 mm and 2 mm.

Returning to FIG. 2, the driving device 220 drives the surface-emitting laser array 201 based on an instruction of the engine control device 222. That is, the driving device 220 drives the surface-emitting laser array 201 so that light is emitted from the ignition device 301 at a timing of the ignition in the operation of the engine 300. Meanwhile, the plurality of light emitting parts in the surface-emitting laser array 201 turn on and off lights simultaneously.

In the embodiment, in a case where the surface-emitting laser array 201 is not required to be arranged at a position separated from the laser resonator 206, the optical fiber 204 may not be provided.

Moreover, here, the case of the engine (piston engine), in which the piston is moved by a combustion gas, as the internal combustion engine is described. This is not limiting. For example, a rotary engine, a gas turbine engine, or a jet engine may be used. It follows that the engine has only to combust fuel to generate a combustion gas.

Moreover, the ignition device 301 may be used in a cogeneration, which is a system of using exhaust heat to extract power, hot heat or cold heat, and thereby comprehensively enhancing energy efficiency.

Moreover, here, the case where the ignition device 301 is used in an internal combustion engine is described. However, this is not limiting.

Moreover, here, the case where the laser device 200 is used in an ignition device is described. However, this is not limiting. For example, the laser device 200 may be used in a laser processing machine, a laser peening device, a terahertz generation device or the like.

(Details)

Next, the surface-emitting laser array 201 according to the embodiment will be described in detail with reference to FIG. 4. Meanwhile, FIG. 4 is a YZ cross-sectional view of a part of the surface-emitting laser array 201.

The surface-emitting laser array 201 includes a substrate 101, a buffer layer 102, a lower semiconductor DBR (distribution Bragg reflector) 103, a lower spacer layer 104, an active layer 105, an upper spacer layer 106, an upper semiconductor DBR 107, a contact layer 109, a protection film 111, an upper electrode 113, a lower electrode 114 and the like.

The substrate 101 is an n-GaAs single crystal substrate, a normal direction of surface of which is inclined with respect to a crystal orientation [1 0 0] direction toward a crystal orientation [1 1 1] A direction by 15 degrees ($\theta$=15°), as shown in FIG. 5A. That is, the substrate 101 is a so-called inclined substrate. Here, as shown in FIG. 5B, the substrate is arranged so that a crystal orientation [0−1 1] direction is a +X direction and a crystal orientation [0 1 −1] direction is a −X direction. Then, an inclined axis of the inclined substrate is parallel to an X-axis direction. Meanwhile, a −Y direction will be also called "inclined direction".

Returning to FIG. 4B, the buffer layer 102 is laminated on a surface of the substrate 101 on the +Z side, and is a layer including n-GaAs.

The lower semiconductor DBR 103 is laminated on the buffer layer 102 on the +Z side, and includes 37.5 pairs of a low refraction index layer of n-AlAs (aluminum arsenide) and a high refraction index layer of n-$Al_{0.3}Ga_{0.7}As$ (aluminum gallium arsenide).

In order to reduce an electric resistance, composition gradient layers having thickness of 20 nm, composition of which changes gradually from one composition toward the other composition, are provided between the respective refraction index layers.

Moreover, from the buffer layer 102 to about the 34.5-th pair, the respective refraction index layers are set to have an optical thickness of $\lambda/4$, where $\lambda$ is the oscillation wavelength, including a half of the adjacent composition gradient layer. Three pairs of the refraction index layers close to the lower spacer layer 104 are set so that the optical thickness of the high refractive index layer is $\lambda/4$ and the optical thickness of the lower refractive index layer is $3\lambda/4$, each including a half of the adjacent composition gradient layer.

Meanwhile, in a case where the optical thickness is $\lambda/4$, an actual thickness D of the layer is $D=\lambda/4n$, where n is the refraction index of medium of the layer.

The lower spacer layer 104 is laminated on the lower semiconductor DBR 103 on the +Z side, and is a non-doped AlGaInP (aluminum gallium indium phosphide) layer.

The active layer 105 is laminated on the lower spacer layer 104 on the +Z side, and has a triple quantum well (TQW) structure, in which a quantum well layer of GaAs and a barrier layer of $Al_{0.3}Ga_{0.7}As$ are alternately laminated.

The upper spacer layer 106 is laminated on the active layer 105 on the +Z side, and is a non-doped AlGaInP layer.

A part including the lower spacer layer 104, the active layer of 105 and the upper spacer layer 106 is also called as a resonator structure, and set to have an optical thickness of a wavelength including a half of the adjacent composition gradient layer. Meanwhile, the active layer 105 is arranged at the center of the resonator structure, which is a position corresponding to an antinode of a stationary wave distribution of an electric field, so as to obtain high induced emission probability.

The upper semiconductor DBR 107 is laminated on the upper spacer layer 106 on the +Z side, and includes 24 pairs of a low refraction index layer of p-$Al_{0.9}Ga_{0.1}As$ and a high refraction index layer of p-$Al_{0.3}Ga_{0.7}As$.

Composition gradient layers are provided between the respective refraction index layers. Then, the respective refraction index layers are set to have an optical thickness of $\lambda/4$ including a half of the adjacent composition gradient layer.

In one of the lower refraction index layers in the upper semiconductor DBR 107, a selected oxide layer 108 of p-AlAs having a thickness of 30 nm is inserted. A position where the selected oxide layer 108 is inserted is a position which is separated from the upper spacer layer 106 by an optical distance of $\lambda/4$.

The contact layer 109 is laminated on the upper semiconductor DBR 107 on the +Z side, and is a layer of p-GaAs.

The protection film 111 is a film of $SiO_2$ or SiN.

The upper electrode 113 is electrically coupled to an electrode pad by a wiring member.

Next, a manufacturing method of the above-described surface-emitting laser array 201 will be described.

(1) The buffer layer 102, the lower semiconductor DBR 103, the lower spacer layer 104, the active layer 105, the upper spacer layer 106, the upper semiconductor DBR 107, the selected oxide layer 108 and the contact layer 109 are formed on the substrate 101 according to crystal growth by using metalorganic chemical vapor deposition (MOCVD) method or the molecular beam epitaxy (MBE) method (See FIG. 6). Meanwhile, the plurality of semiconductor layers laminated on the substrate 101 as described above will be called "laminated body" for the sake of simplicity.

As a group-III material, trimethyl aluminum (TMA), trimethyl gallium (TMG) or trimethyl indium (TMI) is used. As a group-V material, phosphine ($PH_3$) or arshin ($AsH_3$) is used. Moreover, as a material for the p-type dopant, carbon tetrabromide ($CBr_4$) or dimethyl zinc (DMZn) is used. As a material for n-type dopant, hydrogen selenide ($H_2Se$) is used.

(2) A resist pattern corresponding to a shape of mesa is formed on the surface of the laminated body. Specifically, photoresist is applied on the contact layer 109, exposure by an exposure device and developing are performed, and thereby the resist pattern corresponding to the shape of mesa is formed. Here, the mesa is formed to have a cross section of rectangular with a side of 20 μm to 25 μm. Meanwhile, as the resist applied on the contact layer 109, positive resist is used, and a contact exposure is performed.

(3) A mesa having a shape of quadratic prism is formed by dry etching such as reactive ion etching (RIE). Here, a bottom part of etching is positioned in the lower spacer layer 104. Meanwhile, by adjusting condition of dry etching, an inclination angle of a side face of the mesa can be adjusted. Here, the condition of dry etching is adjusted so that the inclination angle of the side of the mesa is 70° to 80° with respect to the surface of the substrate 101. In this case, a breaking of the wiring member is suppressed. Moreover, here, a height of the mesa is 3 μm.

(4) The resist pattern is removed (See FIG. 7).

(5) The laminated body is subjected to heat treatment in steam. Here, Al in the selected oxide layer 108 is oxidized from a periphery of the mesa. Then, in the central part of the mesa, a region 108b which is not oxidized and surrounded by the oxide layer 108a of Al is caused to remain (See FIG. 8). Therefore, an oxidation narrowed structure, which restricts a path of a drive electric current for the light emitting part only to the central part of the mesa, is prepared. The above-described region 108a which is not oxidized is an electric current passing region (electric current injection region). Here, the electric current passing region 108b has an approximately rectangular shape with a side of about 5 μm.

(6) The protection film 111 of SiN is formed by using the plasma CVD method (See FIG. 9). It is preferable that a film thickness of the protection film 111 is from 150 nm to 200 nm, and is preferably 150 nm.

(7) A resist pattern for forming a contact hole is prepared on a top face of the mesa.

(8) The protection film 111 in an opening section of the resist pattern is removed by wet etching using buffered hydrofluoric acid (BHF).

(9) The resist pattern is removed (See FIG. 10).

(10) A resist pattern for masking an emitting region is prepared.

(11) A material of the upper electrode 113 is evaporated. Here, metal films of Cr/AuZn/Au are laminated in series by EB (electron beam) deposition. A thickness of the upper electrode 113 is set to be greater than or equal to the height of the mesa.

(12) By liftoff, a metal film on a region where the resist pattern is formed is removed. Therefore, the upper electrode 113 is formed (See FIG. 11).

(13) After polishing a back side of the substrate 101 until the thickness of the substrate 101 becomes 100 μm to 300 μm, metal films of Cr (9 nm)/AuGe (18 nm)/Au (250 nm) are laminated in series by EB (electron beam) deposition, to form the lower electrode 114 (See FIG. 12). Meanwhile, the thickness of the substrate 101 is preferably 100 μm.

(14) Annealing is performed at 400° C. for 5 minutes, to provide an ohmic conduction between the upper electrode 113 and the lower electrode 114. Therefore, the mesa becomes a light emitting part.

(15) The laminated body is divided into chips.

Incidentally, FIG. 13 shows a relation between a value of x in $Al_xGa_{1-x}As$ and a thermal resistance. According to this relation, the thermal resistance of x=1, i.e. AlAs is the least. Then, in order to enhance the radiation performance of the surface-emitting laser array, the material of the low refraction index layers in the lower semiconductor DBR is preferably AlAs, a thermal resistance of which is small. However, in a case of increasing x in $Al_xGa_{1-x}As$, corrosion (oxidation) becomes likely to occur due to water contents. This property becomes remarkable especially for $0.95<x\leq1$, and corrosion occurs due to water contents contained in the air.

Moreover, the inventors of the present application have found that in the case of $0.95<x\leq1$, corrosion is likely to occur from an etching bottom face. Furthermore, even in a structure where AlAs does not contact the air, in a case of including AlAs close to an outermost layer, water contents gradually intrude and corrosion occurs. Therefore, in a case of using AlAs for the lower semiconductor DBR, a chip is required to be sealed in an atmosphere, which does not contain water contents, through complex processes.

The inventors have found that in a case where an electrode is provided also above the etching bottom face, the electrode functions as a passivation film for preventing water contents in the air from intruding, and the gradual intrusion of water contents from the outermost layer can be suppressed. That is, the upper electrode 113 is provided also in the region between the light emitting parts, and thereby $Al_xGa_{1-x}As$ with $0.95<x\leq1$ can be used for the lower semiconductor DBR 103. Therefore, a surface-emitting laser array having excellent heat dissipation compared with the related art without complex processes is realized.

As is clear from the above descriptions, in the ignition device 301 according to the embodiments, an "optical system for condensing laser light emitted from a laser device" in the ignition device of the present invention is configured with the emission optical system 210. Then, in the laser device 200 according to the embodiments, an "optical system for condensing laser light emitted from a surface-emitting laser array" in the laser device of the present invention is configured with the first condensing optical system 203, and a "transmission member" in the laser device of the present invention is configured with the optical fiber 204.

As described above, in the surface-emitting laser array 201 according to the embodiments, each light emitting part includes the lower semiconductor DBR 103, the active layer 105, the upper semiconductor DBR 107, the upper electrode 113 surrounding the emission region of laser light and the like, which are laminated in series on the substrate 101. The lower semiconductor DBR 103 includes AlAs, and the upper electrode 113 also covers a region between the light emitting parts in the plurality of light emitting parts.

In this case, both the heat dissipation and a corrosion resistance can be achieved. Meanwhile, the lower semiconductor DBR 103 may include $Al_xGa_{(1-x)}As$ ($1>x>0.95$) instead of AlAs. It follows that the lower semiconductor DBR 103 has only to include $Al_xGa_{(1-x)}As$ ($1 \geq x > 0.95$).

Moreover, the etching bottom face upon forming the mesa is in the lower spacer layer 104, and the lower spacer layer 104 includes In. Accordingly, etching selectivity with AlAs on etching is enhanced, and AlAs can be prevented from being exposed on the outermost layer. As a result, reliability can be enhanced.

Moreover, the lower semiconductor DBR 103 is set so that in three pairs close to the lower spacer layer 104 the optical thickness of the high refractive index layer is $\lambda/4$ and the optical thickness of the lower refractive index layer is $3\lambda/4$, each including a half of the adjacent composition gradient layer. In this case, the heat dissipation can be further enhanced. Meanwhile, the lower semiconductor DBR 103 has only to include at least one low refraction index layer having an optical thickness of $(2m+1)\lambda/4$, where m in a natural number.

Moreover, the laser device 200 can emit stably laser light at a high output power, due to the surface-emitting laser array 201. Moreover, it becomes possible to lengthen the life of the laser device 200.

Furthermore, the ignition device 301 can perform stable ignition due to the laser device 200. Moreover, it becomes possible to lengthen the life of the ignition device 301.

Moreover, the engine 300 is provided with the ignition device 301, and as a result, the stability can be enhanced. Furthermore, maintenance intervals for the ignition device 301 can be prolonged.

Meanwhile, in the embodiments, a thickness of the upper electrode 113 is not limited, but an excellent effect can be obtained in a case of the film thickness of greater than or equal to 2 μm.

Moreover, in the embodiment, a surface-emitting laser array of the type, in which a reflection mirror is provided outside, may be employed instead of the surface-emitting laser array 201.

Moreover, in the embodiment, each of the first condensing optical system 203, the second condensing optical system 205 and the emission optical system 210 may be configured with a single lens or a plurality of lenses.

Moreover, in the embodiment, the case where the surface-emitting laser array 201 is used as a light source for excitation in the laser device 200 is described. However, this is not limiting. The surface-emitting laser array 201 may be used as a light source not for excitation in a laser device.

<<Laser Annealing Device>>

FIGS. 14A and 14B are diagrams schematically illustrating an example of a configuration of a laser annealing device 1000 as a laser device. The laser annealing device 1000 includes a light source 1010, an optical system 1020, a table device 1030, a control device, which is not shown, and the like.

The light source 1010 includes the surface-emitting laser array 201. The optical system 2010 guides laser light emitted from the light source 1010 onto a surface of an object P. The table device 1030 includes a table on which the object P is placed. The table is movable along at least a direction of the Y-axis.

For example, in a case where the object P is amorphous silicon (a-Si), temperature of the amorphous silicon (a-Si) irradiated with laser light rises. Thereafter, the amorphous silicon is gradually cooled to become poly-silicon (p-Si).

Moreover, since the light source 1010 includes the surface-emitting laser array 201, the laser annealing device 1000 can enhance processing efficiency stably.

<<Laser Processing Machine>>

FIG. 15 is a diagram schematically illustrating an example of a configuration of a laser processing machine 3000 as a laser device. The laser processing machine 3000 includes a light source 3010, an optical system 3100, a table 3150 on which an object P is placed, a table driving device 3160, an operation panel 3180, a control device 3200 and the like.

The light source 3010 includes the surface emitting laser array 201, and emits laser light based on an instruction from the control device 3200. The optical system 3100 condenses laser light emitted from the light source 3010 at a point adjacent to a surface of the object P. The table driving device 3160 moves the table 3150 in directions of the X-axis, Y-axis and Z-axis based on an instruction from the control device 3200.

The operation panel 3180 includes a plurality of keys for an operator performing various settings, and an indicator for displaying various information. The control device 3200 controls the light source 3010 and the table driving device 3160 based on the various setting information from the operation panel 3180.

Then, since the light source 3010 includes the surface-emitting laser array 201, the laser processing machine 3000 can enhance processing efficiency (e.g. cutting or welding).

Meanwhile, the laser processing machine may include a plurality of light sources 3010.

Moreover, the surface-emitting laser array 201 is also preferable for a device using laser light, other than the laser annealing device and the laser processing machine. For example, the surface-emitting laser array 201 may be used as a light source of a display device.

Although the present invention has been described with reference to embodiments, the present invention is not limited to these embodiments, but various variations and modifications may be made without departing from the scope of the invention as set forth in the accompanying claims.

The present application is based on and claims the benefit of priority of Japanese Priority Applications No. 2015-

051556 filed on Mar. 16, 2015 and No. 2015-166726 filed on Aug. 26, 2015, the entire contents of which are hereby incorporated by reference.

INDUSTRIAL APPLICABILITY

The present invention can be applied to a surface-emitting laser array, a laser apparatus, an ignition device and an internal combustion engine.

REFERENCE SIGNS LIST 101 substrate
102 buffer layer
103 lower semiconductor DBR (reflection mirror)
104 lower spacer layer
105 active layer
106 upper spacer layer
107 upper semiconductor DBR
108 selected oxide layer
109 contact layer
111 protection film
113 upper electrode (electrode)
114 lower electrode
200 laser device
201 surface-emitting laser array
203 first condensing optical system (optical system for condensing laser light emitted from surface-emitting laser array)
204 optical fiber (transmission member)
205 second condensing optical system
206 laser resonator
206a laser medium
206b saturable absorber
210 emission optical system (optical system for condensing laser light emitted from laser device)
212 protection member
220 driving device
222 engine control device
300 engine (internal combustion engine)
301 ignition device
302 fuel injection mechanism
303 exhaust mechanism
304 combustion chamber
305 piston
1000 laser annealing device (laser device)
1010 light source
1020 optical system
1030 table device
3000 laser processing machine (laser device)
3010 light source
3100 optical system
3150 table
3160 table driving device
3180 operation panel
3200 control device
P object

The invention claimed is:

1. A surface-emitting laser array comprising a plurality of light emitting parts, each of the plurality of emitting parts having a structure of a shape of a mesa and including:
a first reflection mirror including aluminum gallium arsenide ($Al_xGa_{(1-x)}As$) where x is greater than 0.95 but less than or equal to 1;
a second reflection mirror;
an active layer between the first reflection mirror and the second reflection mirror; and
an electrode having a thickness greater than or equal to 2 µm,
wherein the electrodes cover regions between mesas in the plurality of light emitting parts.

2. The surface-emitting laser array according to claim 1, wherein a height of a top face of the electrode is greater than or equal to a height of the mesa.

3. The surface-emitting laser array according to claim 1, wherein the reflection mirror includes aluminum arsenide (AlAs).

4. The surface-emitting laser array according to claim 1, wherein an outermost layer of the region between the adjacent light emitting parts in the plurality of light emitting parts includes indium (In).

5. The surface-emitting laser array according to claim 1, wherein the reflection mirror is a multi-layered reflection mirror and includes at least one AlAs layer having an optical thickness of $(2m+1)\lambda/4$ where an oscillation wavelength of the laser light is $\lambda$ and m is a natural number.

6. A laser device for irradiating an object with laser light comprising:
the surface-emitting laser array according to claim 1; and
an optical system configured to guide the laser light emitted from the surface-emitting laser array to the object.

7. A laser device comprising:
the surface-emitting laser array according to claim 1;
an optical system configured to condense the laser light emitted from the surface-emitting laser array; and
a transmission member configured to transmit the laser light condensed by the optical system.

8. A laser device comprising:
the surface-emitting laser array according to claim 1; and
a laser resonator configured to receive the laser light emitted from the surface-emitting laser array.

9. The laser device according to claim 8, wherein the laser resonator is a Q switch laser.

10. The laser device according to claim 9, wherein the laser resonator includes a laser medium and a saturable absorber.

11. An ignition device comprising:
the laser device according to claim 8; and
an optical system configured to condense laser light emitted from the laser device.

12. An internal combustion engine for combusting fuel to generate a combustion gas comprising:
the ignition device for igniting the fuel according to claim 11.

* * * * *